United States Patent
Kim et al.

(10) Patent No.: US 9,349,466 B2
(45) Date of Patent: May 24, 2016

(54) NONVOLATILE MEMORY DEVICE HAVING SELECTABLE SENSING MODES, MEMORY SYSTEM HAVING THE SAME AND PROGRAMMING METHOD THEREOF

(71) Applicant: SAMSUNG ELECTRONICS CO., LTD., Suwon-Si, Gyeonggi-Do (KR)

(72) Inventors: Minseok Kim, Hwaseong-Gyeonggi-Do (KR); Kitae Park, Seongnam-si (KR)

(73) Assignee: SAMSUNG ELECTRONICS CO., LTD., Suwon-Si, Gyeonggi-Do (KR)

(*) Notice: Subject to any disclaimer, the term of this patent is extended or adjusted under 35 U.S.C. 154(b) by 96 days.

(21) Appl. No.: 14/177,457

(22) Filed: Feb. 11, 2014

(65) Prior Publication Data

US 2014/0153339 A1    Jun. 5, 2014

Related U.S. Application Data

(63) Continuation of application No. 13/108,391, filed on May 16, 2011, now Pat. No. 8,675,415.

(30) Foreign Application Priority Data

May 17, 2010    (KR) .................. 10-2010-0046070

(51) Int. Cl.
  *G11C 16/06*  (2006.01)
  *G11C 16/26*  (2006.01)
  *G11C 11/56*  (2006.01)
  *G11C 16/04*  (2006.01)
(52) U.S. Cl.
  CPC ............ *G11C 16/26* (2013.01); *G11C 11/5628* (2013.01); *G11C 16/0483* (2013.01); *G11C 16/06* (2013.01)

(58) Field of Classification Search
  CPC ........... G11C 11/5628; G11C 16/0483; G11C 16/06; G11C 16/26
  See application file for complete search history.

(56) References Cited

U.S. PATENT DOCUMENTS

| | | | |
|---|---|---|---|
| 5,898,617 A | 4/1999 | Bushey et al. | |
| 6,327,185 B1 | 12/2001 | Hirata | |
| 7,236,402 B2 | 6/2007 | Suhail | |
| 7,486,561 B2 | 2/2009 | Mokhlesi | |
| 7,599,224 B2 | 10/2009 | Lee | |
| 8,000,150 B2 * | 8/2011 | Seol et al. | 365/185.22 |
| 2005/0105335 A1 | 5/2005 | Sugimae et al. | |
| 2005/0201151 A1 | 9/2005 | Tran et al. | |
| 2006/0291290 A1 * | 12/2006 | Kim et al. | 365/185.22 |
| 2008/0247237 A1 | 10/2008 | Abe | |
| 2009/0091979 A1 | 4/2009 | Shalvi | |

(Continued)

FOREIGN PATENT DOCUMENTS

| | | |
|---|---|---|
| JP | 08235876 | 9/1996 |
| JP | 201076497 | 3/2001 |
| JP | 2009518766 | 5/2009 |
| KR | 1020010070048 | 7/2001 |
| KR | 1020010092073 | 10/2001 |

(Continued)

*Primary Examiner* — Khamdan Alrobaie
(74) *Attorney, Agent, or Firm* — F. Chau & Associates, LLC

(57) ABSTRACT

A non-volatile memory device includes a sensing mode selector configured to select a sensing mode according to environment information. A page buffer senses a data state of a memory cell in one of a plurality of sensing methods, depending upon the selected sensing mode. Memory device operations include high speed program operations, high speed verify operations, high reliability accurate program operations, and high reliability accurate verify operations.

28 Claims, 18 Drawing Sheets

(56) References Cited

U.S. PATENT DOCUMENTS

2009/0103359 A1 4/2009 Song et al.
2010/0074026 A1* 3/2010 Kang .................. 365/185.25
2010/0259993 A1* 10/2010 Kang .................. 365/185.22
2012/0320675 A1* 12/2012 Kang .................. 365/185.03

FOREIGN PATENT DOCUMENTS

| KR | 1020080080511 | 9/2008 |
| KR | 1020090007298 | 1/2009 |
| KR | 1020090039173 | 4/2009 |
| KR | 1020090129622 | 12/2009 |

* cited by examiner

NONVOLATILE MEMORY DEVICE HAVING SELECTABLE SENSING MODES, MEMORY SYSTEM HAVING THE SAME AND PROGRAMMING METHOD THEREOF

CROSS-REFERENCE TO RELATED APPLICATIONS

This application is a Continuation Application of U.S. patent application Ser. No. 13/108,391 filed on May 16, 2011, which claims under 35 U.S.C §119 priority to and the benefit of Korean Patent Application No. 10-2010-0046070 filed May 17, 2010, the entire content of each which is incorporated by reference herein.

BACKGROUND

1. Technical Field

Exemplary embodiments relate to an electronic device, and more particularly, to a non-volatile memory device and a memory system that implements the non-volatile memory device.

2. Discussion of the Related Art

Semiconductor memory devices are a vital microelectronic component commonly found in digital logic systems, such as computers, and microprocessor-based applications ranging from satellites to consumer electronics. Therefore, advances in the fabrication of semiconductor memory devices, including process enhancements and circuit-design-related developments that allow scaling to higher memory densities and faster operating speeds, help establish performance standards for other digital logic families.

Semiconductor memory devices are divided into volatile semiconductor memory devices and non-volatile semiconductor memory devices. A non-volatile semiconductor memory device can retain stored data even at power-off. Data stored in the non-volatile semiconductor memory device is permanent or reprogrammable according to the memory fabrication technology. The non-volatile semiconductor memory device has been used to store data and program codes in systems such as computers and microprocessor-based applications ranging from satellites to consumer electronics.

A representative example of the non-volatile semiconductor memory device is a flash memory device. As high-density memory devices are needed more and more, multi-bit memory devices which store multi-bit data in one memory cell are typically used. However, such multi-bit memory devices can result in the possibility of more errors since storing multi-bit data in one memory cell reduces the voltage margin separating voltage levels (states) in the cell that yield the desired bit information.

SUMMARY

According to an exemplary embodiment of the present inventive concept a non-volatile memory device is provided. A sensing mode selector selects a sensing mode according to environment information. A page buffer senses a data state of a memory cell in one of a plurality of sensing methods, depending upon the selected sensing mode, and provides data to be written in memory cells connected with a selected word line or data read out from memory cells connected with a selected word line, in accordance with the data state.

The environment information may include a temperature of the non-volatile memory device and the sensing mode selector may include a temperature sensor for measuring the temperature.

The environment information may include noise, and the sensing mode selector may include a noise sensor for measuring the noise.

The environment information may include an address received by the non-volatile memory device.

The sensing mode selector may select a sensing mode differently, depending upon whether a received address is an address directed to a meta block or an address directed to a user block.

The environment information may be a flag bit value which is stored in a spare area of a page and directs a program step.

The environment information may be a state of a memory cell at a program operation.

According to an exemplary embodiment a non-volatile memory device is provided. A sensing mode selector selects a sensing mode according to environment information. A page buffer performs either one of a current sensing and a voltage sensing according to the selected sensing mode for sensing a data state of a memory cell. A control logic controls the timing of the page buffer according to the selected sensing mode. The page buffer provides data to be written in memory cells connected with a selected word line or data read out from memory cells connected with a selected word line, in accordance with the data state.

The sensing mode selector may generate a mode signal corresponding to the selected sensing mode, and the page buffer may include a current sensor for performing the current sensing in response to the mode signal and a voltage sensor for performing the voltage sensing in response to the mode signal, either one of the current sensor and the voltage sensor being activated in response to the mode signal.

According to an exemplary embodiment a page buffer coupleable to a bit line of a memory cell array is provided. A sensing node is coupled to the bit line through a bit line select transistor in series with a bit line control transistor, the bit line select transistor connectable to the bit line in response to a bit line select signal provided from a control logic. A pull-up circuit is connectable to the sensing node in response to a switching operation of a first mode select transistor, the switching operation of the first node select transistor being determined according to a mode signal, the pull-up circuit configured to supply a power supply voltage to the sensing node in response to a bit line setup signal. A pull-down circuit is connectable to the sensing node according to the switching operation of a second mode select transistor, the switching operating of the second mode transistor being determined according to the mode signal, the pull-down circuit configured to supply a ground voltage to the sensing node in response to the bit line setup signal. A cell current determiner is connectable to the sensing node according to a switching operation of a third mode select transistor responsive to the mode signal applied the third mode select transistor. When the mode signal directs voltage sensing the cell current determiner is electrically isolated from the sensing node and when the mode signal directs current sensing, the cell current determiner is electrically connected with the sensing node and upon current sensing the sensing node is electrically connected to the bit line by turning on the bit line control transistor and a bit line select transistor.

The page buffer may further include a sensing latch and a plurality of data latches connected to the sensing node, the sensing latch configured to sense a voltage level of the bit line to store data of a memory cell connected with the bit line, or to store data latched in any one of the data latches at a write operation or a read operation.

The data latches may store data input at a write operation or data latched by the sensing latch.

An inverted version of the mode signal may be supplied to a gate of the first mode select transistor and to a gate of the second mode select transistor.

The cell current determiner may judge a data state by comparing a reference current with current flowing into the bit line connected with the sensing node.

The pull-up circuit may include a PMOS transistor having a drain connected to a power supply, a gate connected to receive the bit line setup signal, and a source connected with a source of the first mode select transistor.

The pull-down circuit may include an NMOS transistor having a drain connected with the sensing node, a gate connected to receive the bit line setup signal, and a source connected with a drain of the second mode select signal.

The bit line control transistor may be configured to prevent a high voltage from being transferred to the sensing node in response to the bit line control signal provided from the control logic.

A memory controller may control the non-volatile memory device and transfer a sensing select command to the non-volatile memory device according to the environment information.

The sensing methods may include a voltage sensing operation, even-numbered bit lines and odd-numbered bit lines being sensed in turn during the voltage sensing operation, and a current sensing operation, all bit lines being pre-charged and sensed simultaneously during the current sensing operation.

The sensing mode may be selected either before of after performing a program operation.

BRIEF DESCRIPTION OF THE DRAWINGS

The following description makes reference to the following figures, wherein like reference numerals refer to like parts throughout the various figures unless otherwise specified.

DETAILED DESCRIPTION

The inventive concept is described more fully hereinafter with reference to the accompanying drawings, in which embodiments of the inventive concept are shown.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Figure 1:
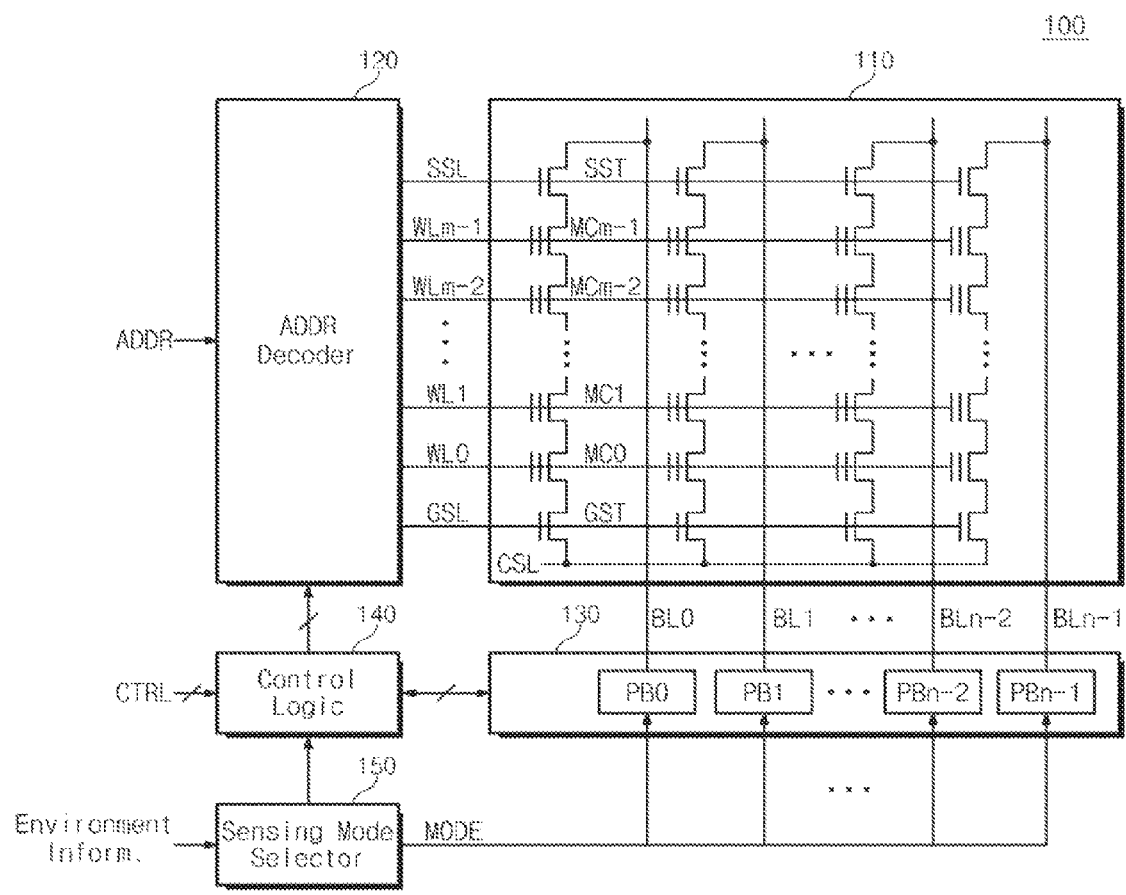
FIG. 1 is a diagram showing a non-volatile memory device according to an exemplary embodiment of the inventive concept.

FIG. 1 is a diagram showing a non-volatile memory device according to an exemplary embodiment of the inventive concept.

Referring to FIG. 1, a non-volatile memory device 100 includes a memory cell array 110, an address decoder 120, an input/output circuit 130, control logic 140, and a sensing mode selector 150.

The non-volatile memory device 100 may include a NAND flash memory device, a NOR flash memory device, a Resistive Random Access Memory (RRAM), a Phase-Change Memory (PRAM), a Magnetroresistive Random Access Memory (MRAM), a Ferroelectric Random Access Memory (FRAM), a Spin Transfer Torque Random Access Memory (STT-RAM), etc. Further, the non-volatile memory device 100 can be formed of a three-dimensional array structure. A NAND flash memory device is described hereinbelow as a representative exemplary embodiment.

The memory cell array 110 comprises multiple memory cells which are formed at intersections of word lines WL0, ... WLm−1 and bit lines BL0, ... BLn−1. Herein, m and n are an integer. The memory cell array 110 may include multiple memory blocks (not shown). As an exemplary embodiment, one memory block is illustrated in FIG. 1. Memory blocks may include multiple pages, each of which includes multiple memory cells connected with a corresponding word line. The non-volatile memory device 100 performs an erase operation in a block unit and a write/read operation in a page unit.

Each of the memory cells is capable of storing one-bit data or M-bit data (M being an integer of 2 or more). A memory cell capable of storing one-bit data in a memory cell is called a single level cell (SLC). The SLC has an erase state or a program (write) state based upon threshold voltage. SLCs have the advantage of faster program speed and lower power consumption. On the other hand, a memory cell capable of storing M-bit data in a memory cell is called a multi level cell (MLC). For example, a typical MLC can store four states per cell so that the four states yield two bits of information per cell. The MLC has any one of an erase state and multiple program states based upon threshold voltage. The MLC allows more bits to be stored as opposed to an SLC and can reduce cell area as well as die size for a given desired density.

Continuing to refer to FIG. 1, the memory cell array 110 is formed of a cell string structure. Each cell string includes a string select transistor SST connected to a string select line SSL, multiple memory cells MC0, . . . MCm−1 each connected to word lines WL0, . . . WLm−1, and a ground select transistor GST connected to a ground select line GSL. Herein, the SST is connected between a bit line and a string channel, and the GST is connected between a string channel and a common source line CSL.

The address decoder 120 is connected to the memory cell array 110 through select lines SSL, GSL and word lines WL0, . . . WLm−1. The address decoder 120 selects a word line according to an input address at a program or read operation. Herein, the selected word line is connected with memory cells which are to be programmed or to be read.

Further, the address decoder 120 supplies a selected word line, unselected word lines, and select lines SSL, GSL with bias voltages (for example, a program voltage, a pass voltage, a string select voltage, a ground select voltage) needed for a program or read operation. The bias voltages may be generated by a voltage generator (not shown).

The input/output circuit 130 is connected with the memory cell array 110 through bit lines BL0, . . . BLn−1. The input/output circuit 130 includes multiple page buffers PB0, . . . PBn−1, which temporarily store data to be programmed (written) in memory cells connected with a selected word line or data read out from memory cells connected with a selected word line.

Each of the multiple page buffers PB0, . . . PBn−1 can perform a sensing operation according to multiple sensing methods. The multiple page buffers PB0, . . . PBn−1 perform a sensing operation according to one of multiple sensing methods in response to a mode signal MODE. Herein, the mode signal MODE is a signal for selecting a sensing mode. In other words, the sensing method of the page buffers PB0, . . . PBn−1 may be determined according to the mode signal MODE. Herein, the sensing operation may be applied to a program (write) operation, a read operation, and an erase operation.

The control logic 140 controls an overall operation (for example, programming/reading/erasing) of the non-volatile memory device 100. The control logic 140 performs a program/read/erase operation according to control signals CTRL provided externally.

The control logic 140 controls the address decoder 120 and the input/output circuit 130 and can perform a program operation according to an incremental step pulse programming (ISPP) manner, which gradually increases the program voltage to first program the easier cells and then the harder cells. The control logic 140 controls a voltage generator (not shown) so as to generate a program voltage having a voltage level corresponding to a loop (repeat) number at a program operation. The program voltage thus generated may be provided to a selected word line. The control logic 140 controls the voltage generator so as to generate a pass voltage to be provided to unselected word lines at a program operation.

The sensing mode selector 150 selects any one of multiple sensing modes depending on circumstance information. Herein, the circumstance information may include at least one of temperature, noise, address, program step, memory cell state, etc. The sensing mode selector 150 generates a mode signal MODE corresponding to the sensing mode selected according to the circumstance information. These sensing modes can include one which provides accurate voltage distribution (e.g., voltage sensing), and one that operates at high speed (e.g. current sensing).

In an exemplary embodiment, the sensing mode selector 150 may include a temperature sensor (not shown) for measuring a temperature of the non-volatile memory device 100 or a temperature sensor (not shown) for measuring a temperature of the memory cell array 110. Herein, the temperature sensor for measuring the temperature of the memory cell array 110 can use any one cell within the memory cell array 110. That is, one cell within the memory cell array 110 can be used as a temperature sensor. For example, when the temperature of the non-volatile memory device 100 or the memory cell array 110 is over a predetermined value, the sensing mode selector 150 selects a sensing mode which is insensitive to temperature.

In an exemplary embodiment, the sensing mode selector 150 selects a sensing mode differently upon receiving of an address directing to a user block and upon receiving of an address directing to a meta block (e.g., a block containing content data). Herein, the user block is programmed by an MLC program operation, and the meta block is programmed by an SLC program operation.

When an address directing to a user block is received at a program operation, the sensing mode selector 150 selects an accurate sensing mode for sufficiently providing accurate MLC voltage distributions.

Upon an input of an address which directs to a meta block necessitating data reliability, during a program operation, a read operation may be carried out after a pre-read operation for program verification. For this, the sensing mode selector 150 selects a high-speed sensing mode at a pre-read operation and an accurate sensing mode at a read operation.

In an exemplary embodiment, the sensing mode selector 150 selects sensing modes for least significant bit (LSB) and most significant bit (MSB) program operations differently. For example, at the LSB program operation, the sensing mode selector 150 selects a sensing mode in which a high speed sensing operation is carried out. At the MSB program operation, the sensing mode selector 150 selects a sensing mode in which an accurate sensing operation is carried out.

In another exemplary embodiment, the sensing mode selector 150 is capable of selecting a sensing mode depending upon flag bit information directing a program step. Herein, the program step may be one of an LSB program step, a 2-bit program step, a 3-bit program step, a 4-bit program step, etc. at a multi-bit program method. Further, the flag bit information may be included in a spare area of a page. The sensing mode selector 150 selects a sensing mode according to flag bit information read out at a program operation. For example, when the flag bit information directs a 3-bit program step or a 4-bit program step, the sensing mode selector 150 selects a sensing mode in which an accurate sensing operation is carried out.

In still another exemplary embodiment, the sensing mode selector 150 is capable of selecting a sensing mode according to a memory cell state, that is, a data bit to be programmed.

For example, when a memory cell of an erase state is programmed, the sensing mode selector 150 selects a high-speed sensing mode.

The non-volatile memory device 100 according to an exemplary embodiment of the inventive concept can perform an optimum sensing operation according to circumstance information by having a sensing mode selector 150 for selecting a sensing mode according to circumstance information, page buffers PB0 to PBn−1 for performing the sensing operation according to the sensing method determined pursuant to the selected sensing mode, and the control logic 140 for performing timing control according to the selected sensing mode. As a result, there can be enhanced performance of the non-volatile memory device 100.

Figure 2:
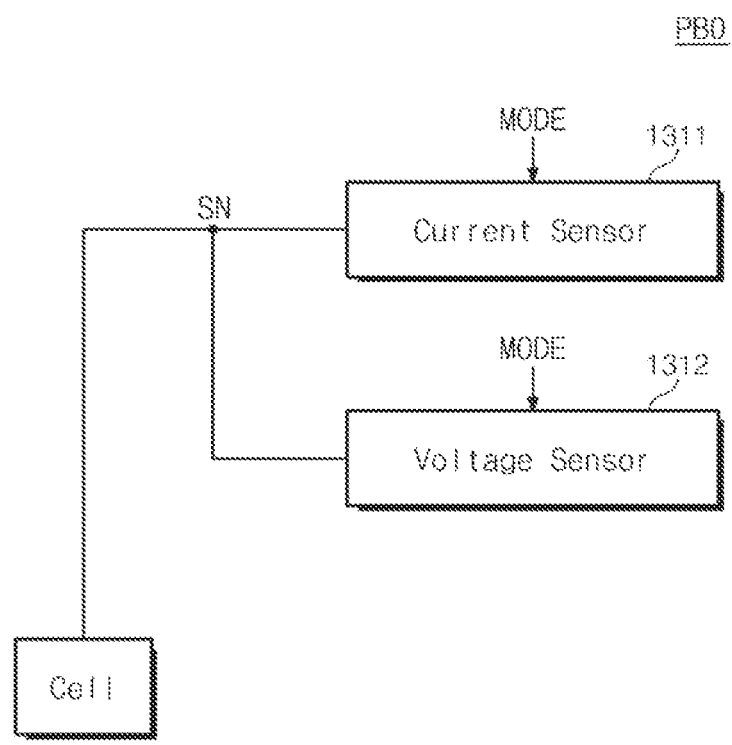
FIG. 2 is a block diagram showing a page buffer according to an exemplary embodiment of the inventive concept.

FIG. 2 is a block diagram showing a page buffer according to an exemplary embodiment of the inventive concept. Referring to FIG. 2, a page buffer PB0 includes a current sensor 1311 and a voltage sensor 1312.

The current sensor 1311 senses a current of a sensing node SN in response to a mode signal MODE. Herein, the sensing node is connected with a memory cell. The voltage sensor 1312 senses a voltage of the sensing node SN in response to the mode signal MODE. In an exemplary embodiment the current sensor 1311 and the voltage sensor 1312 can operate to be complementary to the mode signal MODE such that when the current sensor 1311 is activated by the mode signal MODE, the voltage sensor 1312 is inactivated by the mode signal MODE.

When the current sensor 1311 is activated, control logic 140 (refer to FIG. 1) controls the timing so as to pre-charge bit lines and to sense the pre-charged bit lines simultaneously. When the voltage sensor 1312 is activated, the control logic 140 controls the timing so as to sense even-numbered bit lines and odd-numbered bit lines in turn. This process reduces the coupling of bit lines.

The current sensor 1311 is used to sense at a high speed, and the voltage sensor 1312 is used to sense data accurately. The capacitance used for current sensing of the current sensor 1311 is relatively less than that used for voltage sensing of the voltage sensor 1312.

Figure 3:
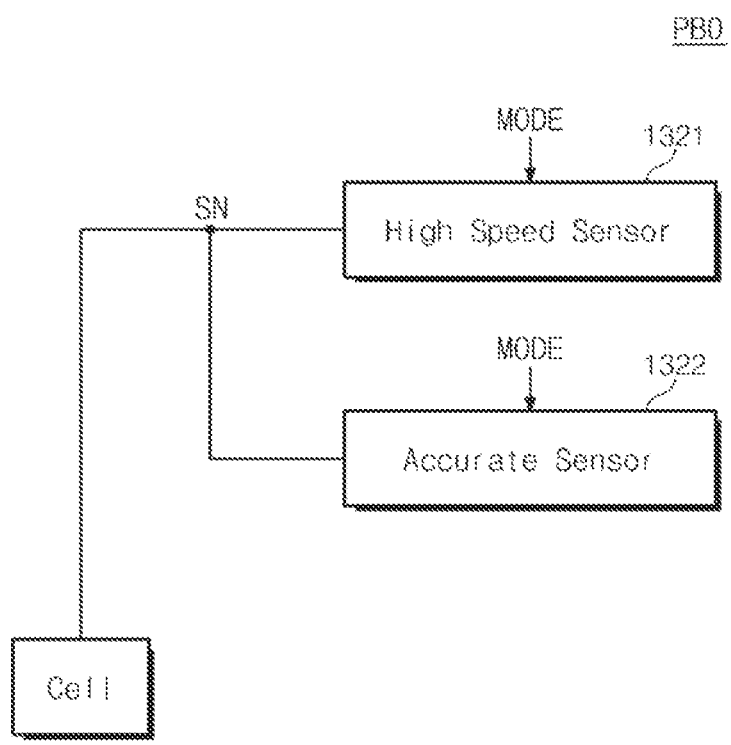
FIG. 3 is a block diagram showing a page buffer according to an exemplary embodiment of the inventive concept.

FIG. 3 is a block diagram showing a page buffer according to an exemplary embodiment of the inventive concept. Referring to FIG. 3, a page buffer PB0 includes a high-speed sensor 1321 and an accurate sensor 1322.

The high-speed sensor 1321 responds to a mode signal MODE to sense data corresponding to a sensing node at high speed. Herein, the sensing node SN is connected with a memory cell. In an exemplary embodiment, the high-speed sensor 1321 can be a current sensor. The accurate sensor 1322 responds to the mode signal MODE to sense data corresponding to the sensing mode SN accurately. In an exemplary embodiment, the accurate sensor 1322 can be a voltage sensor.

In an exemplary embodiment the high-speed sensor 1321 and the accurate sensor 1322 operate such that when the high-speed sensor 1321 is activated by the mode signal MODE, the accurate sensor 1322 is inactivated by the mode signal MODE.

Figure 4:
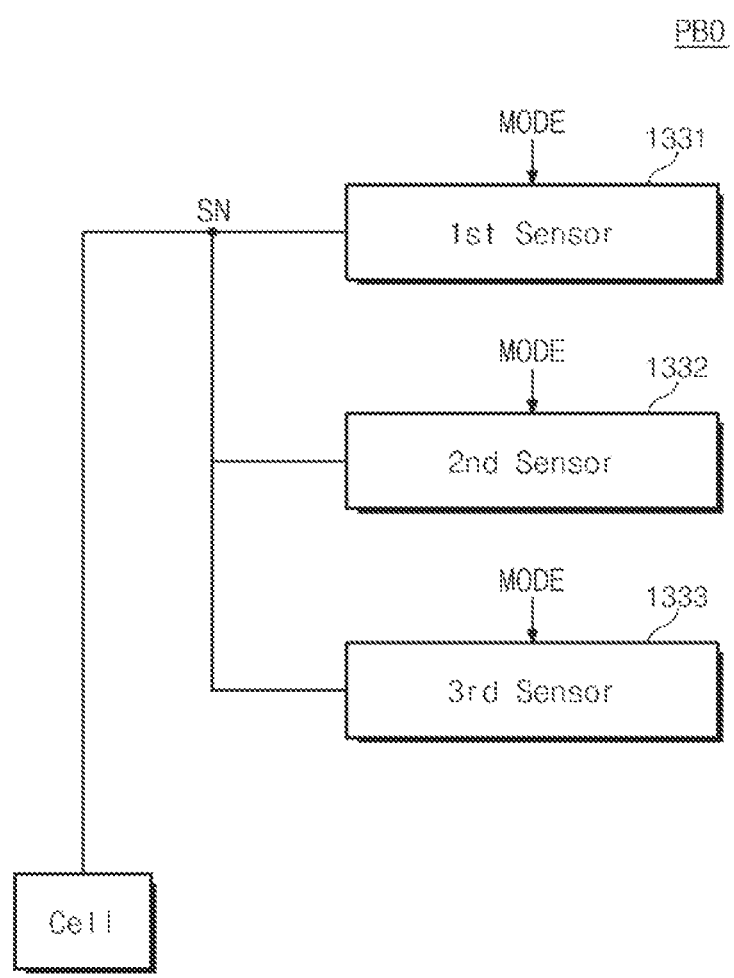
FIG. 4 is a block diagram showing a page buffer according to an exemplary embodiment of the inventive concept.

FIG. 4 is a block diagram showing a page buffer according to an exemplary embodiment of the inventive concept. Referring to FIG. 4, a page buffer PB0 includes the first sensor 1331, the second sensor 1332, and the third sensor 1333. Herein, the sensors 1331, 1332, 1333 perform a sensing operation utilizing different methods.

The first sensor 1331 responds to a mode signal MODE to sense data corresponding to a sensing node SN. Herein, the sensing mode SN is connected with a memory cell. The second sensor 1332 responds to the mode signal MODE to sense data corresponding to the sensing node SN. The third sensor 1333 responds to the mode signal MODE to sense data corresponding to a sensing node SN.

Any one of the first to third sensors 1331, 1332, 1333 is activated in response to the mode signal MODE. Herein, the mode signal MODE may be a digital signal. For example, the first sensor 1331 is activated when the mode signal MODE is '00', the second sensor 1332 is activated when the mode signal MODE is '01', and the third sensor 1333 is activated when the mode signal MODE is '10'.

In FIG. 4, there is illustrated an example that a page buffer PB0 includes three sensors 1331, 1332, 1333. But, the number of sensors is not limited to three sensors. For example, four or more sensors can be provided in a page buffer. Herein, sensing methods of the sensors are different from one another, and any one of the sensors is activated according to a mode signal MODE.

Figure 5:
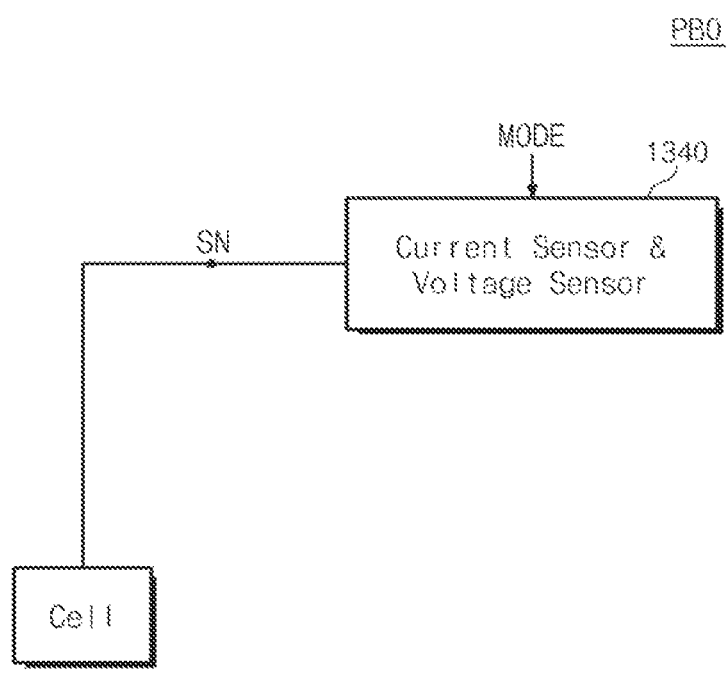
FIG. 5 is a block diagram showing a page buffer according to an exemplary embodiment of the inventive concept.

FIG. 5 is a block diagram showing a page buffer according to an exemplary embodiment of the inventive concept. Referring to FIG. 5, a page buffer PB0 includes both a current and voltage sensor 1340 which selects current sensing or voltage sensing by controlling transistors in response to a mode signal MODE.

Figure 6:
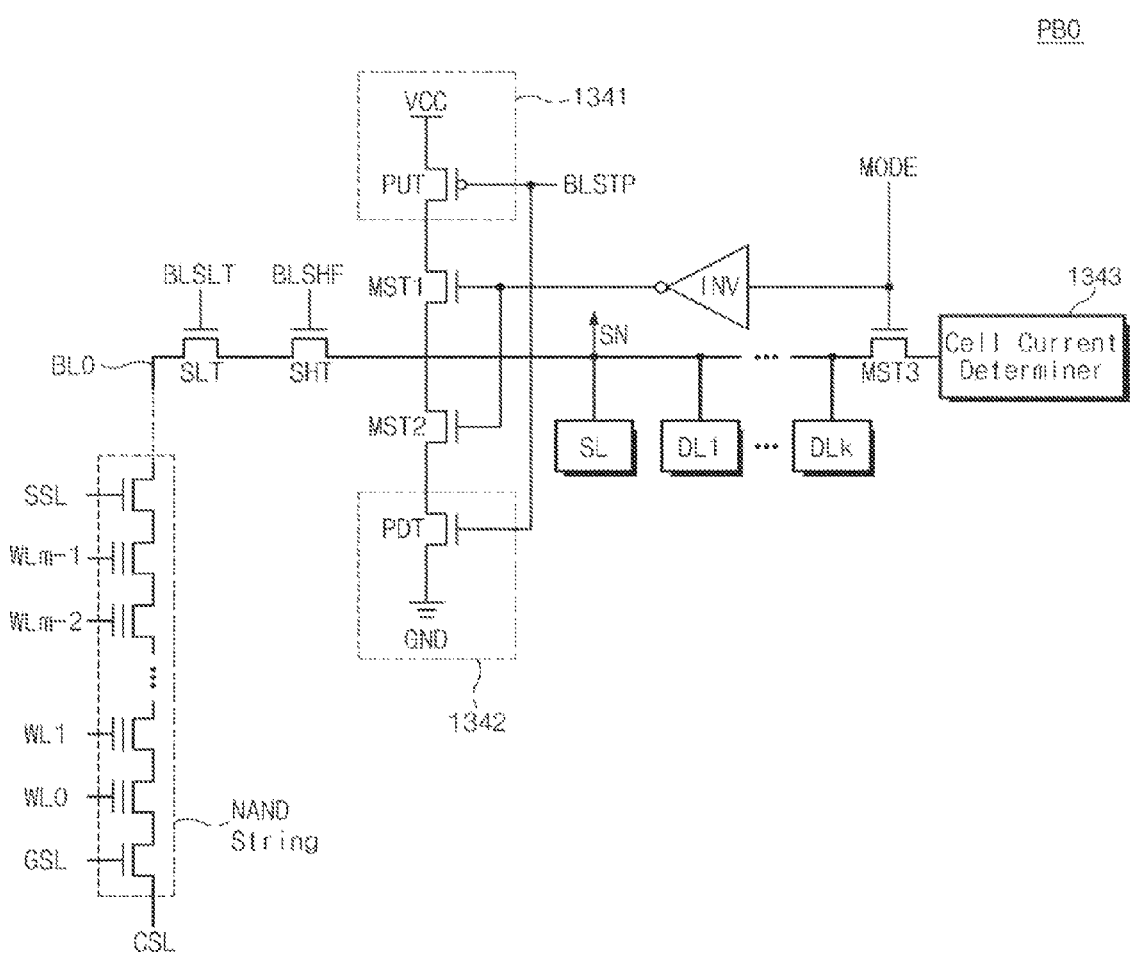
FIG. 6 is a circuit diagram showing a page buffer of FIG. 2.

FIG. 6 is a circuit diagram showing a page buffer of FIG. 2.

Referring to FIG. 6, a page buffer PB0 includes a pull-up circuit 1341, a pull-down circuit 1342, a cell current determiner 1343, a current bit line control transistor SHT, a bit line select transistor SLT, the first to third mode select transistors MST1, MST2, MST3, an inverter INV, a sensing latch SL, and multiple data latches DL0, . . . DLk. Herein, k is an integer.

The pull-up circuit 1341 is connected to a sensing mode SN according to a switching operation of the first mode select transistor MST1. Herein, a switching operation of the first mode select transistor MST1 is determined according to a mode signal MODE. An inverted version of the mode signal transferred via the inverter IVN is supplied to a gate of the first mode select transistor MST1. The pull-up circuit 1341 is formed to supply a power supply voltage VCC to the sensing node SN in response to a bit line setup signal BLSTP.

In an exemplary embodiment, the pull-up circuit includes a PMOS transistor PUT which has a drain connected to a power supply voltage VCC, a gate connected to receive the bit line setup signal BLSTP, and a source connected with a source of the first mode select transistor MST1.

When the mode signal MODE directs voltage sensing, the pull-up circuit 1341 applies a power supply voltage VCC to the sensing node SN in response to the bit line setup signal BLSTP. Herein, when a signal level of the mode signal MODE is a power supply voltage VCC, the page buffer PB0 performs a voltage sensing operation. Herein, the bit line setup signal BLSTP may be provided from control logic 150 (refer to FIG. 1).

The pull-down circuit 1342 is connected with the sensing node SN according to a switching operation of the second mode select transistor MST2. Herein, an inverted version of the mode signal MODE transferred via the inverter INV is supplied to a gate of the second mode select transistor MST2. The pull-down circuit 1342 is formed to provide a ground voltage GND (e.g., 0V) to the sensing node SN in response to the bit line setup signal BLSTP. The pull-down circuit 1342 is electrically connected with the sensing mode SN to apply 0V to a bit line BL0.

In an exemplary embodiment, the pull-down circuit 1342 includes an NMOS transistor PDT which has a drain connected with the sensing node SN, a gate connected to receive the bit line setup signal BLSTP, and a source connected with a drain of the second mode select signal MST2. The pull-down circuit 1342 supplies 0V to the sensing node SN in response to the bit line setup signal BLSTP.

The cell current determiner 1343 is connected to the sensing node SN according to a switching operation of the third mode select transistor MST3. The mode signal MODE is applied to a gate of the third mode select transistor MST3. For example, when the mode signal MODE has a ground voltage, that is, when the mode signal MODE directs voltage sensing, the cell current determiner 1343 is electrically isolated from the sensing node SN. On the other hand, when the mode signal MODE has a power supply voltage, that is, when the mode signal MODE directs current sensing, the cell current determiner 1343 is electrically connected with the sensing node SN. Upon current sensing, the sensing node SN is electrically connected to a memory cell via the bit line BL0. This is accomplished by turning on a bit line control transistor SHT and a bit line select transistor SLT.

The cell current determiner 1343 judges a data state by comparing a reference current with current flowing into the bit line BL0 connected with the sensing node SN. Herein, the reference current may be current which flows into a capacitor having a predetermined capacitance value.

The bit line control transistor SHT prevents a high voltage from being transferred to the sensing node SN in response to the bit line control signal BLSHF. That is, the bit line control transistor SHT is used to protect the page buffer PB0 from a high voltage applied to the bit line BL0. The bit line control signal BLSHF is provided from the control logic 150.

The bit line select transistor SLT is connected between the bit line control transistor SHT and the bit line BL0. The bit line select transistor SLT connects the bit line BL0 to the page buffer PB0 in response to a bit line select signal BLSLT, which is provided from the control logic 150.

The sensing latch senses a voltage level of the bit line BL0 to store data of a memory cell connected with the bit line BL0, or stores data latched in any one of the data latches DL0, . . . DLk at a program operation or a read operation. The data latches DL0, . . . DLk store data input at a program operation or data latched by the sensing latch SL.

In an exemplary embodiment, the transistors SLT, SHT, MST1, MST2, MST3, the inverter INV, the pull-up circuit 1341, and the pull-down circuit 1342 constitute a voltage sensor 1312 (refer to FIG. 2). Further, the transistors SLT, SHT, MST1, MST2, MST3, the inverter INV, and the cell current determiner 1343 may constitute a current sensor 1311 (refer to FIG. 2).

The representative page buffer PB0 according to an exemplary embodiment of the inventive concept connects either one of the voltage and current sensors to the sensing node in response to the mode signal MODE. The other page buffers PB1, . . . PBn−1 are configured to be substantially similar to the page buffer PB0 in FIG. 6.

Figure 7:
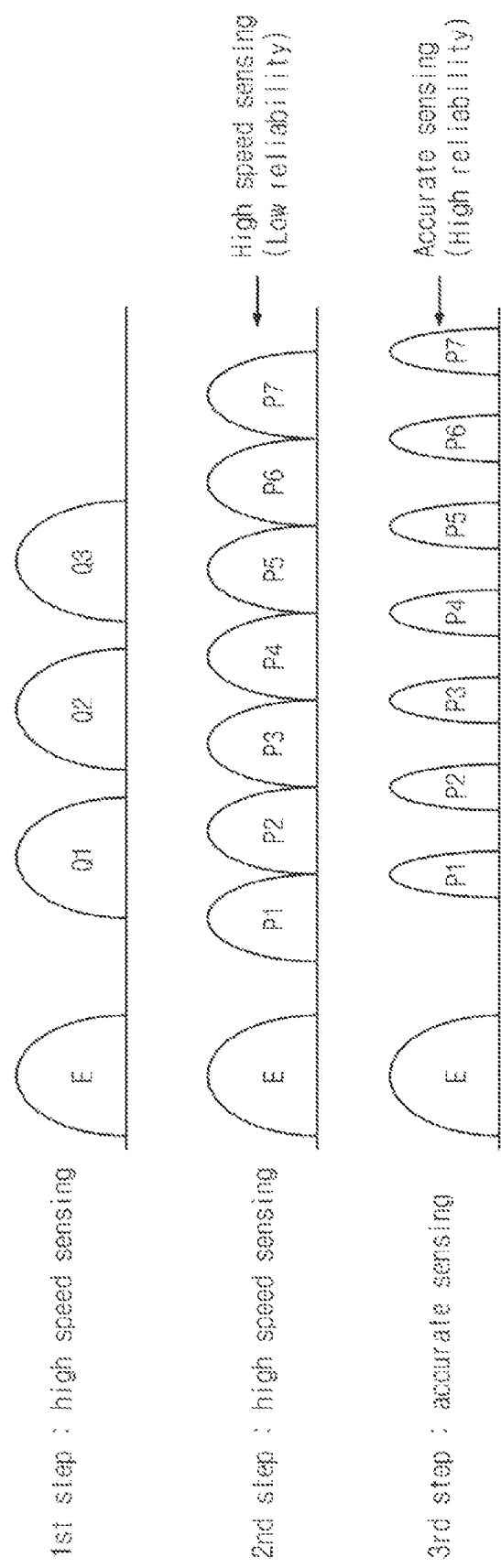
FIG. 7 is a diagram for describing a program method using a sensing manner according to an exemplary embodiment of the inventive concept.

FIG. 7 is a diagram for describing a program method using a sensing manner according to an exemplary embodiment of the inventive concept. Referring to FIG. 7, a sensing method may be determined differently according to a program step. Herein, the program step may correspond to a flag bit stored in a spare area of a page directing a program step.

The first program step comprises performing a high-speed sensing operation. Herein, the first program step comprises a 2-bit MLC program operation. With the 2-bit MLC program operation, a cell state may become any one of an erase state E and the first to third program states Q1, . . . Q3. That is, each program state proves a voltage level in accordance with a 2-bit MLC program (write) operation.

The second program step comprises performing a high-speed sensing operation. Herein, the second program step comprises a 3-bit MLC program operation. With the 3-bit MLC program operation, a cell state may become any one of an erase state E and the first to seventh program states P1, . . . P7. That is, each program state proves a voltage level in accordance with a 3-bit MLC program (write) operation. The high-speed sensing operation is carried out when high data reliability is not required.

The third program step comprises performing an accurate sensing operation. Herein, the accurate sensing may be voltage sensing. The accurate sensing operation can secure the data reliability considering temperature, noise, etc.

With a program method of the inventive concept, all program steps are applied not with the same sensing manner but with different sensing manners. This makes it possible to obtain good accurate MLC voltage distributions. As such, program performance is enhanced by providing voltages that are customized for the particular memory cell write operation environment.

Figure 8:
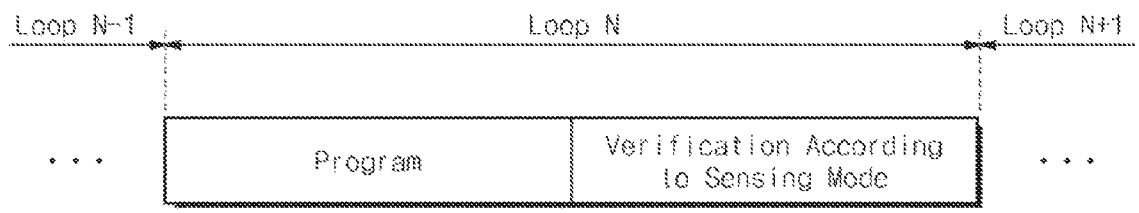
FIG. 8 is a diagram showing a program loop according to an exemplary embodiment of the inventive concept.

FIG. 8 is a diagram showing a program loop according to an exemplary embodiment of the inventive concept. Referring to FIG. 8, a program loop includes a program step, and a program verify step according to a sensing mode, the sensing mode being selected according to circumstance information.

Figure 9:
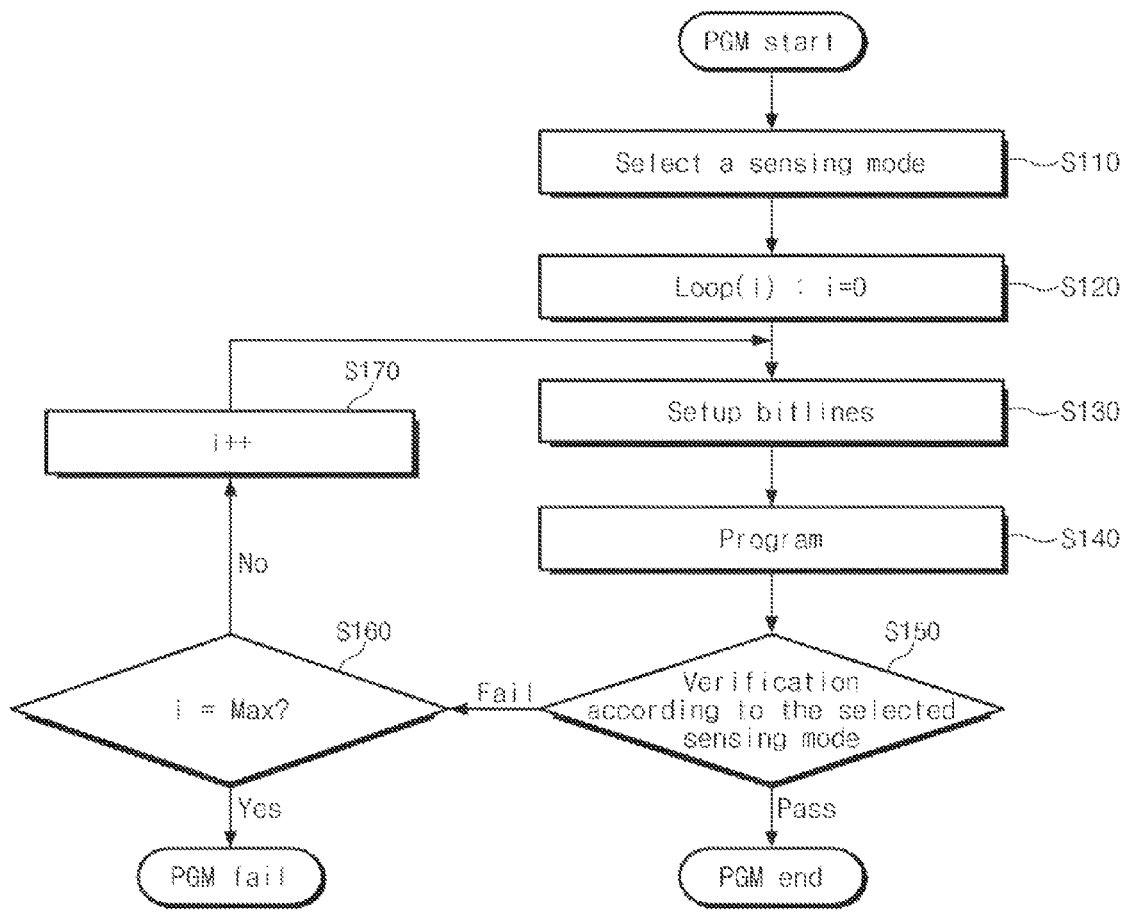
FIG. 9 is a flow chart showing a program method of a non-volatile memory device according to an exemplary embodiment of the inventive concept.

FIG. 9 is a flow chart showing a first embodiment for a program method of a non-volatile memory device according to an exemplary embodiment of the inventive concept. A program method of a non-volatile memory device 100 will be described with reference to FIGS. 1 to 9.

In step S110, a sensing mode selector 150 selects a sensing mode according to environment information. Data to be programmed may be loaded onto each of page buffers PB0, . . . PBn−1 of an input/output circuit 130. Further, a voltage generator (not shown) may generate bias voltages (for example, a program voltage, a pass voltage, a high voltage, a well voltage, a verify-read voltage, etc.) necessary for a program operation under the control of control logic 150. In step S120, the control logic 150 proceeds with the first program loop Loop(i) (i being 1).

In step S130, bit lines BL0, . . . BLn−1 are set up according to data loaded onto the page buffers PB0, . . . PBn−1. In step S140, memory cells are programmed by applying a pass voltage to unselected word lines and a program voltage Vpgm to a selected word line. Herein, a level of the program voltage Vpgm may increase by a predetermined value as a program loop number increases. A pass voltage can be applied to a selected word line during a predetermined time before the program voltage Vpgm is applied thereto. Afterwards, a program recovery operation is carried out. During the program recovery operation, there are discharged voltages of word lines WL0, . . . WLm−1, a string select line SSL, and bit lines BL0, . . . BLn−1.

The control logic 150 may perform a verify-read operation for judging whether memory cells are programmed normally, based on at least one verify voltage. Herein, the verify-read operation may be executed according to a selected sensing mode. In step S150, the control logic 150 judges whether a verify-read operation is passed. If a verify-read operation fails, in step S160 the control logic 150 judges whether the loop number Loop(i) reaches its max value. If so, the program operation is completed as failing. On the other hand, if the loop number is not the max value, in step S170, the loop number increases by 1. And then, a next program loop may proceed. If the verify-read operation is judged as passing in step S150, the procedure is completed.

With the program method of the non-volatile memory device, it is possible to select a sensing mode according to circumstance information and perform a verify-read operation according to the selected sensing mode at a program verify operation.

Figure 10:
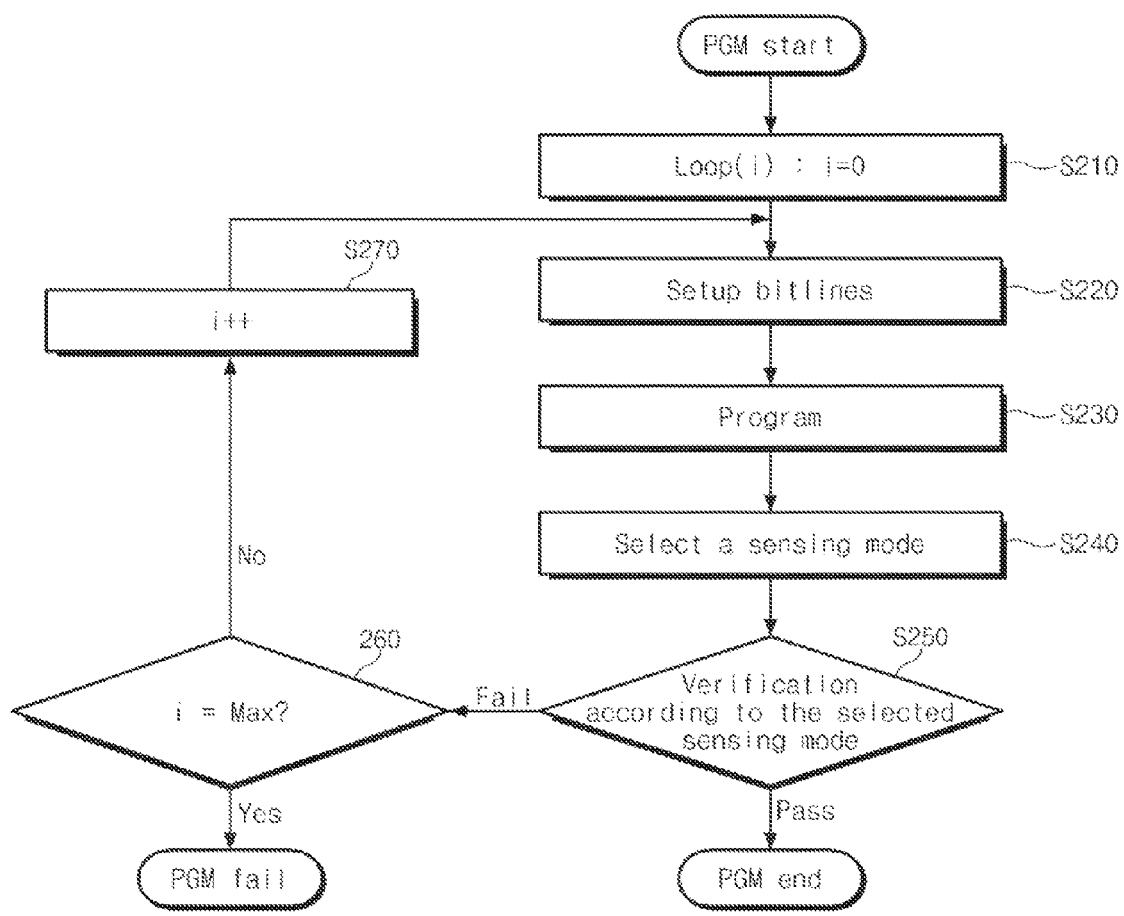
FIG. 10 is a flow chart showing a program method of a non-volatile memory device according to an exemplary embodiment of the inventive concept.

FIG. 10 is a flow chart showing a second embodiment for a program method of a non-volatile memory device according to an exemplary embodiment of the inventive concept. A program method of a non-volatile memory device 100 will be described with reference to FIGS. 1 to 8 and 10.

Data to be programmed may be loaded onto each of page buffers PB0, . . . PBn−1 of an input/output circuit 130. Further, a voltage generator (not shown) may generate bias voltages (for example, a program voltage, a pass voltage, a high voltage, a well voltage, a verify-read voltage, etc.) necessary for a program operation under the control of control logic 150. In step S210, the control logic 150 proceeds with the first program loop Loop(i) (i being 1).

In step S220, bit lines BL0, . . . BLn−1 are set up according to data loaded onto the page buffers PB0, . . . PBn−1. In step S230, memory cells are programmed by applying a pass voltage to unselected word lines and a program voltage Vpgm to a selected word line. Herein, a level of the program voltage Vpgm may increase by a predetermined value as a program loop number increases. A pass voltage can be applied to a selected word line during a predetermined time before the program voltage Vpgm is applied thereto. Afterwards, a program recovery operation is carried out. During the program recovery operation, there are discharged voltages of word lines WL0, . . . WLm−1, a string select line SSL, and bit lines BL0, . . . BLn−1.

In step S240, a sensing mode selector 150 selects a sensing mode according to environment information. Herein, the environment information may be a program step or a program cell state.

The control logic 150 may perform a verify-read operation for judging whether memory cells are programmed normally, based on at least one verify voltage. Herein, the verify-read operation may be executed according to a selected sensing mode. In step S250, the control logic 150 judges whether a verify-read operation has passed. If a verify-read operation has failed, in step S260, the control logic 150 judges whether the loop number Loop(i) reaches its max value. If so, the program operation is completed as failing. On the other hand, if the loop number is not the max value, in step S270, the loop number increases by 1. And then, a next program loop may proceed. If the verify-read operation is judged as passing in step S250, the procedure is completed.

With the program method of the non-volatile memory device, it is possible to select a sensing mode according to circumstance information and perform a verify-read operation according to the selected sensing mode at a program verify operation.

In FIGS. 1 to 10, a sensing mode of a non-volatile memory device 100 is determined according to environment information. But, the inventive concept is not limited thereto. For example, a sensing mode can be determined by a memory controller which controls a non-volatile memory device 100.

Figure 11:
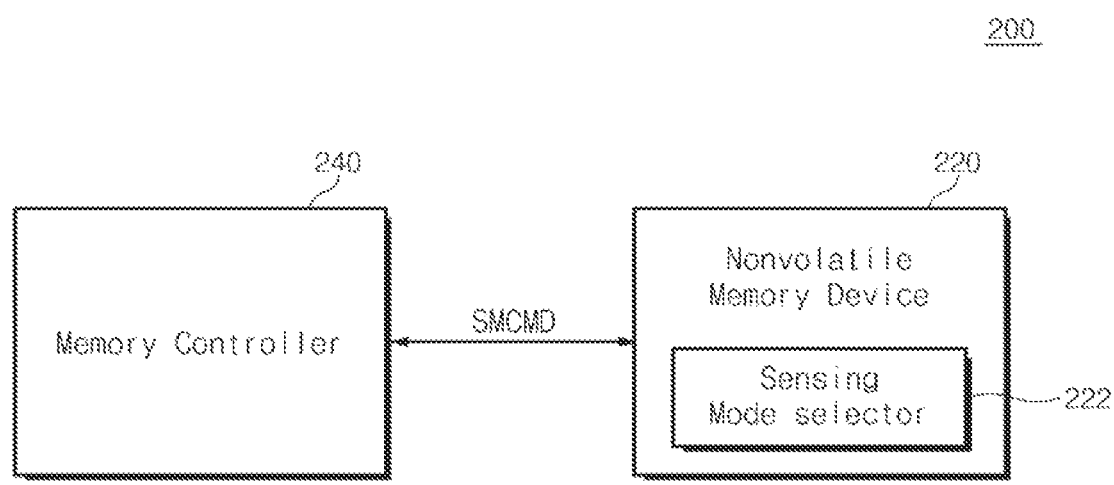
FIG. 11 is a block diagram showing a memory system according to an exemplary embodiment of the inventive concept.

FIG. 11 is a block diagram showing a memory system according to an exemplary embodiment of the inventive concept. Referring to FIG. 11, a memory system 200 includes a non-volatile memory device 220 and a memory controller 240.

The non-volatile memory device 220 can be realized to have any one of multiple sensing modes. The non-volatile memory device 220 includes a sensing mode selector 222 which selects one of multiple sensing modes according to a sensing mode select command.

The memory controller 240 controls the non-volatile memory device 220, generates a sensing mode select command for selecting one of the sensing modes according to environment information, and sends the sensing mode select command to the non-volatile memory device 220. Herein, the environment information can be collected by the non-volatile memory device 220 or by the memory controller 240.

In FIGS. 10 and 11, a program-verify operation is carried out according to a sensing mode which is selected according environment information. But, the inventive concept is not limited to the program-verify operation. The inventive concept can be applied to a read operation and an erase operation according to a sensing mode which is selected according environment information.

Figure 12:
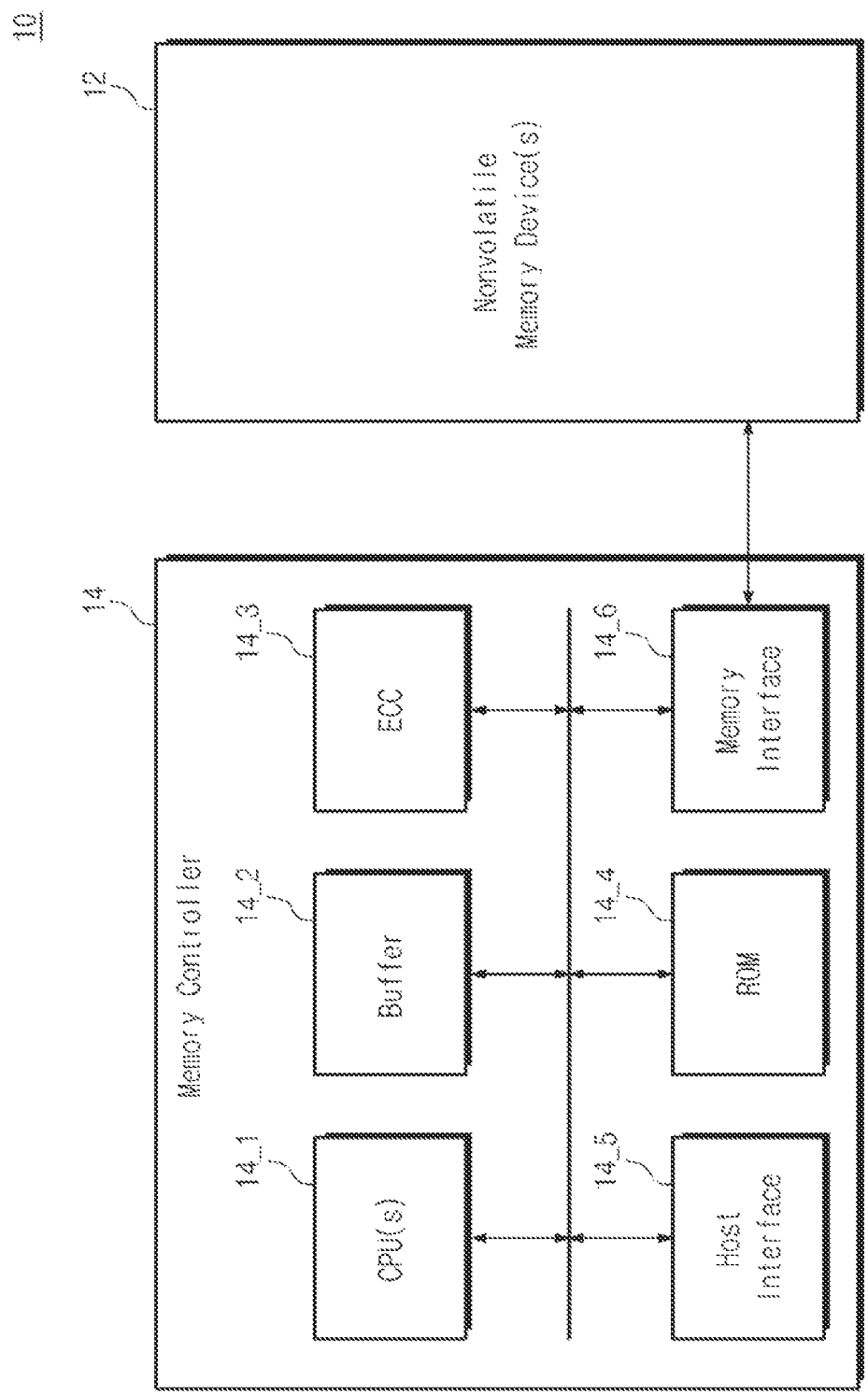
FIG. 12 is a block diagram showing a memory system having a non-volatile memory device according to an exemplary embodiment of the inventive concept.

FIG. 12 is a block diagram showing a memory system having a non-volatile memory device according to an exemplary embodiment of the inventive concept. Referring to FIG. 12, a memory system 10 comprises a non-volatile memory device 12 and a memory controller 14.

The non-volatile memory device 12 is typically configured similar to any one of non-volatile memory devices 100, 220 of FIGS. 1 and 11.

The memory controller 14 controls the non-volatile memory device 12 in response to a request from an external source, such as a host. For example, the memory controller 14 typically controls program, read, and erase operations of the non-volatile memory device 12. If the non-volatile memory device 12 is similar to that non-volatile memory device 220 in FIG. 11, the memory controller 14 is configured similar to that in FIG. 11.

The memory controller 14 provides an interface between the non-volatile memory device 14 and the host. In certain embodiments, the memory controller 14 drives firmware that controls the non-volatile memory device 12.

The memory controller 14 comprises a central processing unit (CPU) 14_1, a buffer 14_2, an error correction code (ECC) circuit 14_3, a ROM 14_4, a host interface 14_5, and a memory interface 14_6.

The CPU 14_1 controls general operations of the memory controller 14.

The buffer 14_2 is used as an operating memory of the CPU 14_1. In response to a program request from the host, data received from the host is temporarily stored in the buffer 14_2. In addition, in response to a read request from the host, data read from the non-volatile memory device 12 is temporarily stored in the buffer 14_2.

In a program operation, the ECC circuit 14_3 decodes data stored in the buffer 14_2 to generate an error correction code that can be used subsequently to decode errors in the data after it is stored in the non-volatile memory device 12. The decoded data and the error correction code are then stored in the non-volatile memory device 12. In a read operation, the ECC circuit 14_3 restores data read from the non-volatile memory device 12 using the generated error correction code value.

The ROM 14_4 stores data necessary for driving the memory controller 14.

The host interface 14_5 implements a protocol for exchanging data between the host and the memory controller 14. As examples, the memory controller 14 can communicate with the host using a protocol such as universal serial bus (USB) protocol, multimedia card (MMC) protocol, peripheral component interconnection (PCI) protocol, PCI-express (PCI-E) protocol, advanced technology attachment (ATA) protocol, serial-ATA protocol, parallel-ATA protocol, small computer small interface (SCSI) protocol, enhanced small disk interface (ESDI) protocol, and integrated drive electronics (IDE) protocol.

The memory interface 14_6 provides an interface between the non-volatile memory device 12 and the memory controller 14.

The memory system 10 of the inventive concept can improve the program performance at a program operation by performing an optimizing sensing operation according to temperature and noise.

Figure 13:
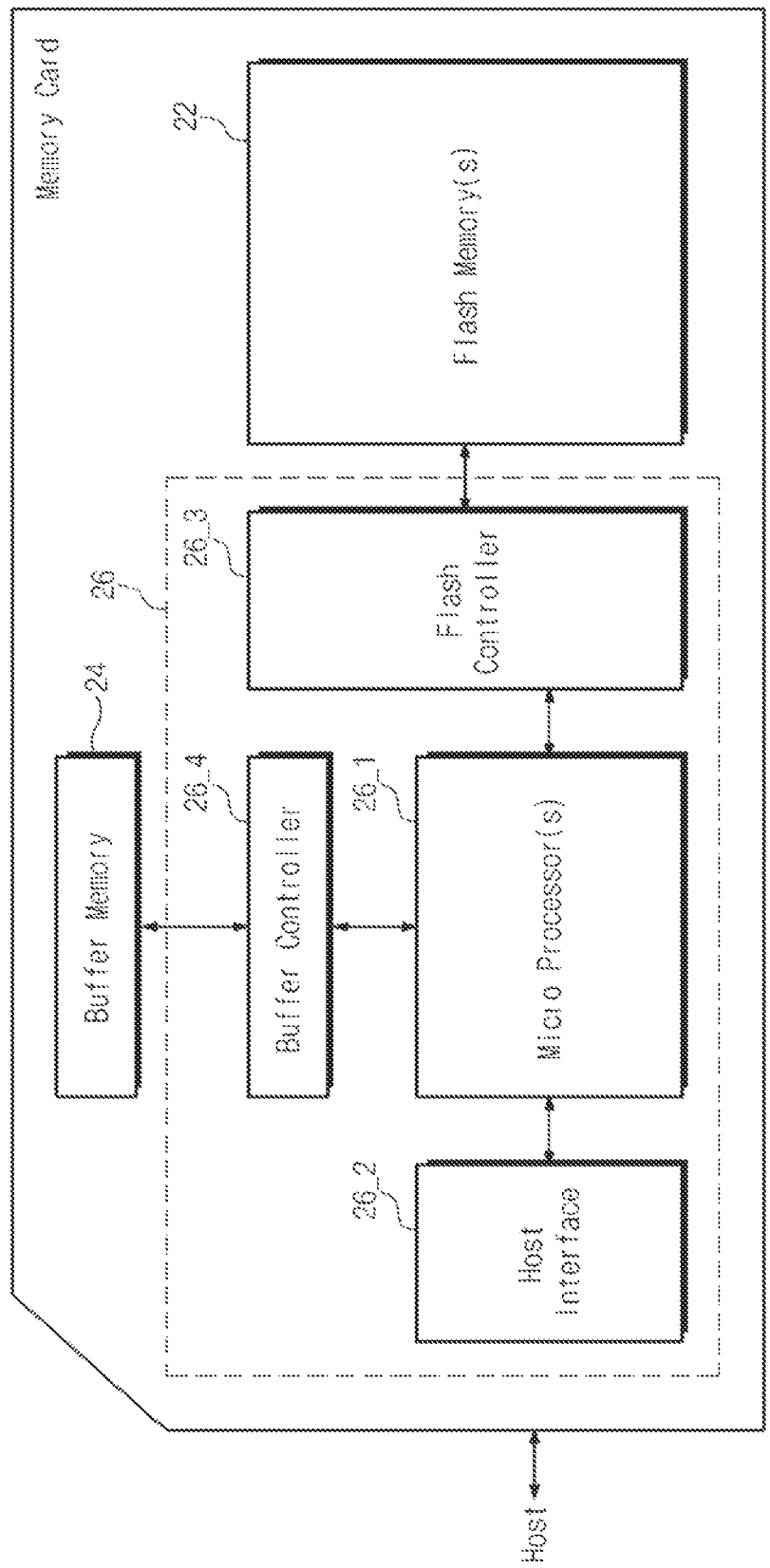
FIG. 13 is a block diagram showing a memory card according to an exemplary embodiment of the inventive concept.

FIG. 13 is a block diagram showing a memory card according to an exemplary embodiment of the inventive concept. Referring to FIG. 13, a memory card 20 includes a flash memory device 22, a buffer memory device 24, and a memory controller 26.

The flash memory device 22 is typically configured similar to any one of non-volatile memory devices 100, 220 of FIGS. 1 and 11.

The buffer memory device 24 is used to store data produced during an operation of the memory card 20. The buffer memory device 24 is formed of DRAM or SRAM.

The memory controller 26 is connected between the host and the flash memory device 22. In response to a request from the host, the memory controller 26 accesses the flash memory device 22.

The memory controller 26 includes a microprocessor 26_1, a host interface 26_2, a flash controller 26_3, and a buffer controller 26_4.

The memory controller 26 is configured to drive firmware for controlling the flash memory device 22. The host interface 26_2 interfaces with the host via a card, for example, a multimedia card (MMC) protocol for exchanging data between the host and memory controllers 26_3, 26_4.

The memory card 20 can be applied to an MMC, a security digital (SD) card, miniSD, a memory stick, a smart media card, a transflash card, etc.

The memory card 20 improves the accuracy of MLC voltage distribution at a program (write) operation by providing an optimizing sensing operation according to environment information, for example, temperature and noise. As a result, the data reliability of the memory card 20 can be improved.

Figure 14:
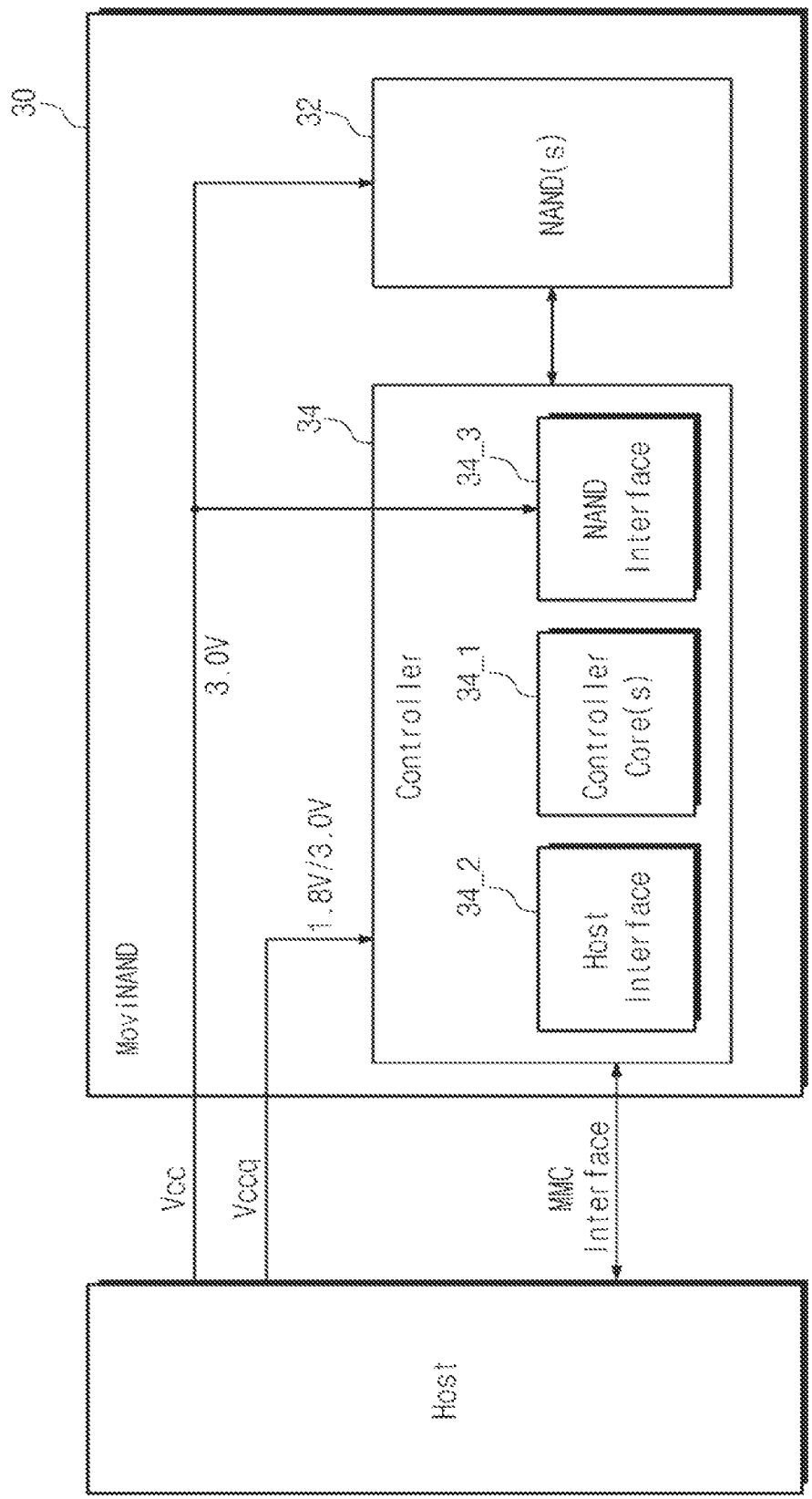
FIG. 14 is a block diagram showing a moviNAND™ memory card according to an exemplary embodiment of the inventive concept. (moviNAND is a trademark of Samsung Electronics, Co. Ltd.)

FIG. 14 is a block diagram showing a moviNAND™ embedded memory card that combines an MMC controller with NAND flash memory and associated firmware, according to an exemplary embodiment of the inventive concept. Referring to FIG. 14, moviNAND™ memory card 30 comprises a NAND flash memory device 32 and a memory controller 34.

The NAND flash memory device 32 is formed by stacking single NAND flash memory devices in one package, such as a fine-pitch ball grid array (FBGA). Each single NAND flash memory is typically configured substantially similar to one of non-volatile memory devices 100, 220 of FIGS. 1 and 11.

The controller 34 comprises a controller core 34_1, a host interface 34_2, and a NAND interface 34_3. The controller core 34_1 controls general operations of moviNAND™ memory card 30. The host interface 34_2 forms an interface between controller 34 and an MMC of a host. The NAND interface 34_3 provides an interface between NAND flash memory device 32 and controller 34.

moviNAND™ memory card 30 receives power voltages Vcc, Vccq from a host. Power voltage Vcc of 3V is applied to NAND flash memory device 32 and NAND interface 26, and power voltage Vccq of 1.8 V/3V is applied to controller 34.

moviNAND™ memory card 30 can improve the reliability of stored data by providing an optimizing sensing operation according to circumstance information.

The inventive concept can be further applied to a solid state driver (SSD).

Figure 15:
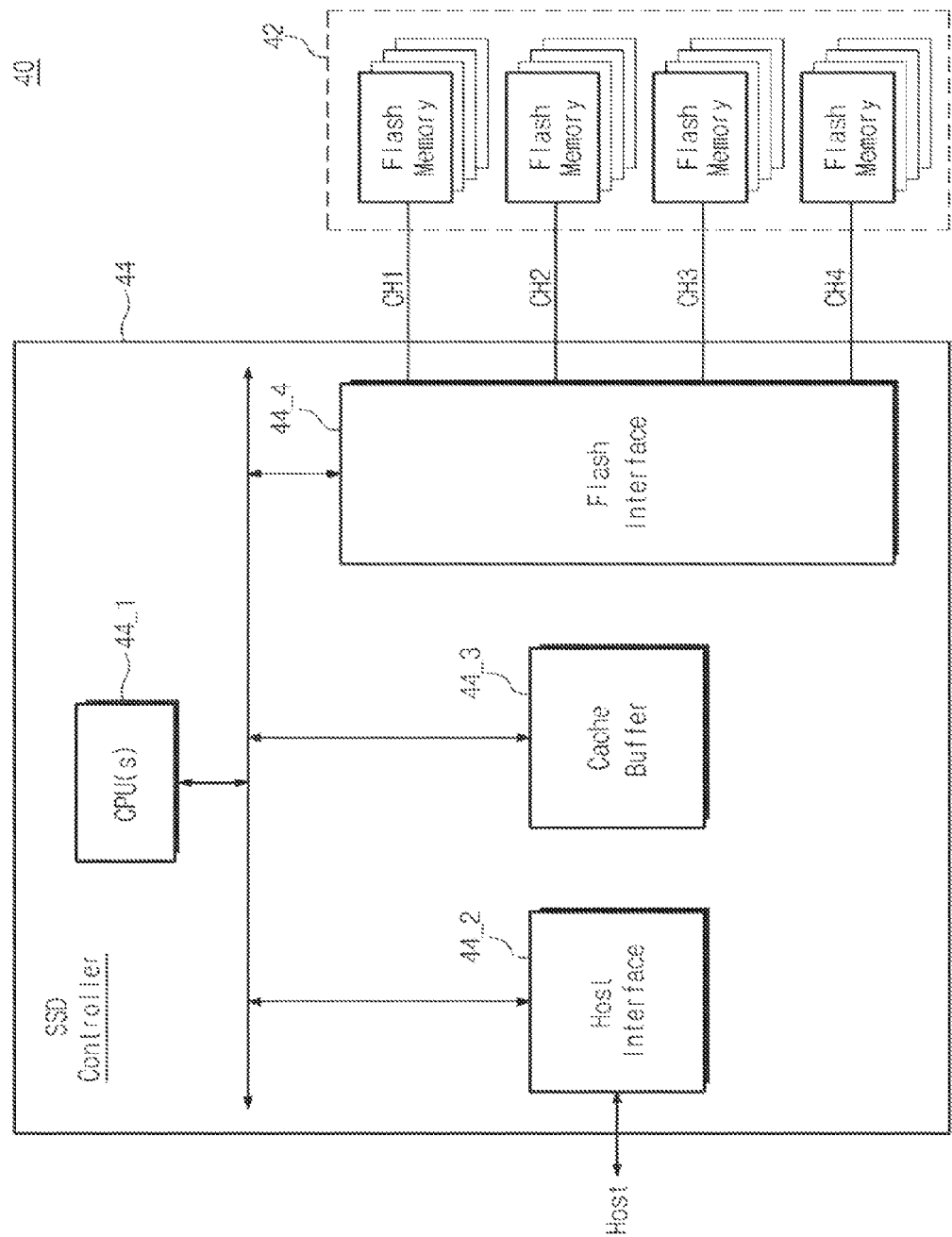
FIG. 15 is a block diagram showing a solid state driver according to an exemplary embodiment of the inventive concept.

FIG. 15 is a block diagram showing an SSD according to an exemplary embodiment of the inventive concept. Referring to FIG. 15, SSD 40 includes multiple flash memory devices 42 and an SSD controller 44.

Each of the flash memory devices 42 is typically configured substantially similar to one of non-volatile memory devices 100, 220 of FIGS. 1 and 11.

The SSD controller 44 includes a CPU 44_1, a host interface 44_2, a cache buffer 44_3, and a flash interface 44_4.

The host interface 44_2 exchanges data with a host in an ATA protocol manner according to the control of the CPU 44_1. Herein, the host interface 44_2 may be one of serial advanced technology attachment (SATA), parallel advanced technology attachment (PATA), and external serial advanced technology attachment (ESATA) bus interfaces.

Data received from the host via the interface 44_2 or to be sent to the host may be transferred via the cache buffer 44_3 without passing a CPU bus, under the control of the CPU 44_1.

The cache buffer 44_3 temporarily stores data transferred between an external source and the flash memory devices 42. Further, the cache buffer 44_3 is used to store programs to be operated by the CPU 44_1. The cache buffer 44_3 may be a buffer memory formed of SRAM.

The flash interface 44_4 provides an interface between the SSD controller 44 and the flash memory devices 42 used as storage. The flash interface 44_4 is configured to support a NAND flash memory, a One-NAND flash memory, a multi-level flash memory, and a single-level flash memory.

The SSD 40 can improve a threshold voltage distribution by selecting a sensing mode according to temperature and performing a program operation according to the selected sensing mode. As a result, the SSD 40 can improve the reliability of stored data at a program operation.

Figure 16:
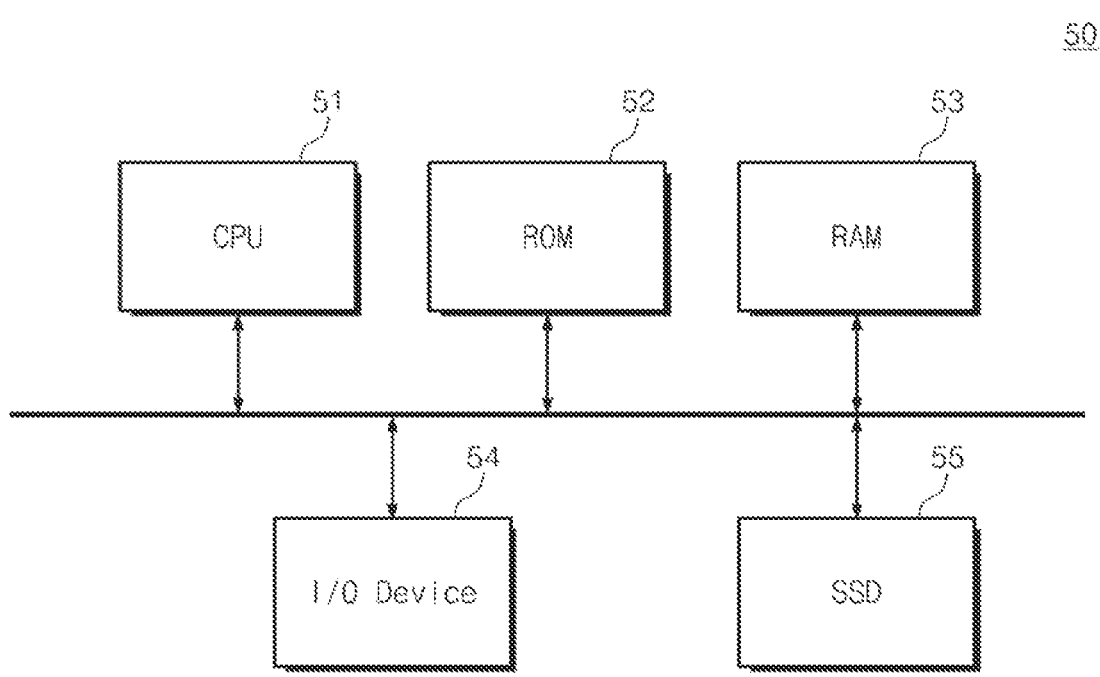
FIG. 16 is a block diagram showing a computing system including a solid state driver of FIG. 15.

FIG. 16 is a block diagram showing a computing system including an SSD of FIG. 15. Referring to FIG. 16, a computing system 50 comprises a CPU 51, a ROM 52, a RAM 53, an input/output device 54, and an SSD 55.

The CPU 51 is connected to a system bus. The ROM 52 stores data used to drive computing system 50. The data typically comprises a start command sequence, and a basic input/output operation system sequence. The RAM 53 is used to temporarily store data used during the operation of CPU 51.

The input/output device 54 is typically connected to the system bus through an input/output device interface such as a keyboard, a pointing device (e.g., a mouse), a monitor, and a modem.

The SSD 55 is a readable and writable storage device and can be substantially similar to SSD 40 of FIG. 15.

Figure 17:
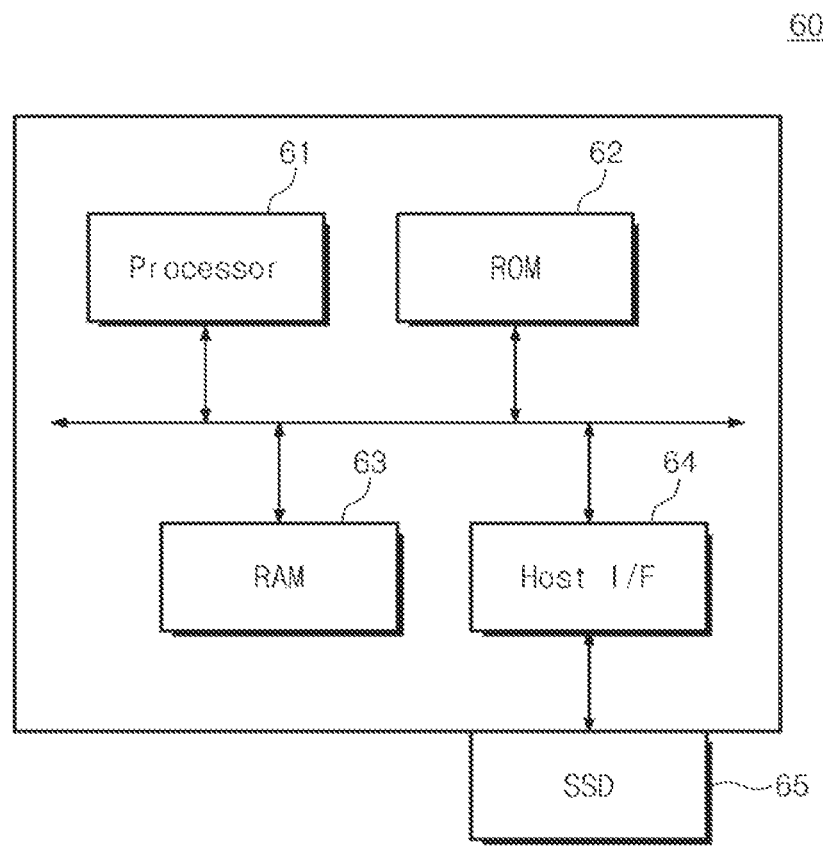
FIG. 17 is a block diagram showing an electronic device having a solid state driver of FIG. 15.

FIG. 17 is a block diagram showing an electronic device having a solid state drive in FIG. 15. Referring to FIG. 17, an electric device 60 comprises a processor 61, a ROM 62, a RAM 63, a flash interface 64, and an SSD 65.

The processor 61 accesses the RAM 63 to execute firmware or other code. Additionally, the processor 61 accesses the ROM 62 to execute fixed command sequences such as a start command sequence or a basic input/output operation system sequence. The flash interface 64 provides an interface between the electronic device 60 and the SSD 65.

The SSD 65 is detachable from the electronic device 60. The SSD 65 is typically implemented similar to SSD 40 of FIG. 15.

The electronic device 60 can comprise, for instance, a cellular phone, a personal digital assistant (PDA), a digital camera, a camcorder, a portable audio playing device (e.g., an MP3 player), or a PMP.

Figure 18:
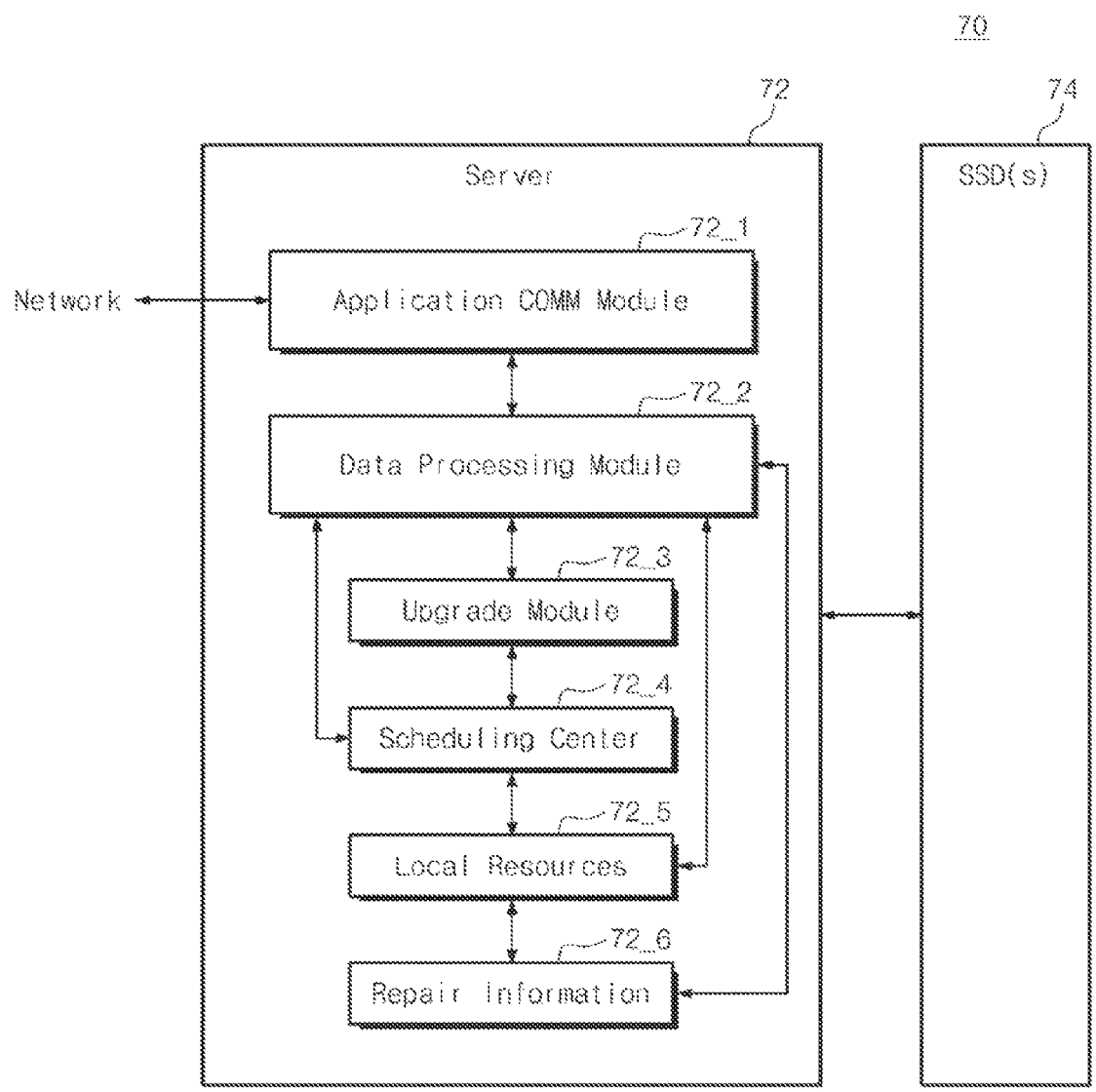
FIG. 18 is a block diagram showing a server system using a solid state driver of FIG. 15.

FIG. 18 is a block diagram showing a server system using a solid state drive in FIG. 15. Referring to FIG. 18, a server system 70 comprises a server 72 and an SSD 74 for storing data necessary to operate server 72. The SSD 74 is generally configured similar to SSD 40 of FIG. 15.

The server 72 comprises an application communication module 72_1, a data processing module 72_2, an upgrade module 72_3, a scheduling center 72_4, a local resource module 72_5, and a repair information module 72_6.

The application communication module 72_1 facilitates communication between the server 72 and a computing system connected to a network, and between the server 72 and the SSD 74. The application communication module 72_1 transmits data or information provided through the user interface to the data processing module 72_2.

The data processing module 72_2 is linked to the local resource module 72_5. The local resource module 72_5 provides a list of repair ships/dealers/technical information to a user based on data or information input to the server 72.

The upgrade module 72_3 interfaces with the data processing module 72_2. The upgrade module 72_3 upgrades firmware, reset code, diagnosis system upgrades, and other information based on data transmitted from the SSD 74.

The scheduling center 72_4 provides a real time option to a user based on data or information input to the server 72.

The repair information module 72_6 interfaces with the data processing module 72_2. The repair information module 72_6 is used to provide repair related information, such as audio, video, or text files, to a user. The data processing module 72_2 packages information based on information delivered from the SSD 74. Later, this information is transmitted to the SSD 74 or displayed to a user.

In general, a server has a heating problem. This makes the reliability of memory cells to be lowered at a program operation. But, the server system 70 improves the data reliability by including SSD 74 which uses an optimum sensing mode according to temperature at a program operation.

The memory systems and/or storage devices described above can be mounted in various forms of packages. For example, the memory systems and/or storage devices can be mounted in package configurations such as package on package (PoP), ball grid array (BGA), chip scale packages (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

The above-disclosed exemplary embodiments are considered illustrative, and not restrictive, and the appended claims are intended to cover all such exemplary embodiments, and any modifications, enhancements, and other embodiments.

What is claimed is:

1. A method for operating a nonvolatile memory device, the method comprising:
performing a first program operation for storing M-bit data in memory cells using a high speed sensing verify operation with a first sensing timing;
performing a second program operation for storing at least M-bit data in the memory cells using an accurate sensing verify operation with a second sensing timing,
wherein the first sensing timing and the second sensing timing are different, and
wherein each of the first program operation and the second program operation is a single complete program operation that is finished when memory cells connected to a selected word line are programmed so that a plurality of program states is generated when the respective first program operation and the second program operation is completed.

2. The method of claim 1, wherein each of the first and the second sensing timing includes a bit line pre-charging time and a pre-charged bit line sensing time.

3. The method of claim 2, wherein a bit line pre-charging time of the first sensing timing is a current sensing bit line pre-charging time and a bit line pre-charging time of the second sensing timing is a voltage sensing bit line pre-charging time.

4. The method of claim 2, wherein a pre-charged bit line sensing time of the first sensing timing is a pre-charged bit line current sensing time and a pre-charged bit line sensing time of the second sensing timing is a pre-charged bit line voltage sensing time.

5. The method of claim 1, wherein the M-bit data is 3-bit data.

6. The method of claim 1, wherein the M-bit data is 2-bit data.

7. The method of claim 1, wherein each of the low reliability high speed program operation and the high reliability accurate program operation includes a plurality of programming voltage pulses for storing the M-bit data in the memory cells.

8. A method for operating a nonvolatile memory device, the method comprising:
performing a high speed program operation for storing M-bit data in memory cells using a high speed verify operation using a first sensing manner;
performing a high reliability accurate program operation for storing M-bit data in the memory cells using a high reliability accurate verify operation using a second sensing manner,
wherein each of the first and second performings has at least one different read bias,
wherein each of the high speed program operation and the high reliability accurate program operation is a single complete program operation that is finished when memory cells connected to a selected word line are programmed so that a plurality of program states is generated when the respective high speed program operation and the high reliability accurate program operation is completed.

9. The method of claim 8, wherein M-bit data is 3-bit data.

10. The method of claim 8, wherein the at least one different read bias includes a verify voltage.

11. The method of claim 8, wherein the high speed verify operation is a pre-verify operation.

12. The method of claim 8, wherein the high reliability accurate verify operation is a pre-verify operation and a verify operation.

13. The method of claim 8, wherein each of the low reliability high speed program operation and the high reliability accurate program operation includes a plurality of programming voltage pulses for storing the M-bit data in the memory cells.

14. A non-volatile memory device comprising:
- a memory cell array including a plurality of memory blocks, wherein each of the memory blocks includes a plurality of pages, each of which includes a plurality of memory cells connected to corresponding word line;
- an address decoder configured to select a word line in a selected memory block among the memory blocks according to an input address;
- a plurality of page buffers configured to sense data from memory cells connected to the selected word line through bit lines and to store data in the memory cells connected to the selected word line through the bit lines; and
- a control logic configured to control the address decoder and the page buffers for performing a low reliability high speed program operation for storing M-bit data in the memory cells using a low reliability high speed sensing verify operation using a first sensing timing, performing a high reliability accurate program operation for storing at least one M-bit data in the memory cells using a high reliability accurate sensing verify operation with a second sensing timing
- wherein each of the low reliability high speed program operation and the high reliability accurate program operation is a single complete program operation that is finished when memory cells connected to a selected word line are programmed so that a plurality of program states is generated when the respective low reliability high speed program operation and the high reliability accurate program operation is completed.

15. The non-volatile memory device of the claim 14, the control logic includes a sensing mode selector for selecting a sensing mode according to the low reliability high speed program operation and the high reliability accurate program operation and varying a sensing timing according to the selected sensing mode.

16. The non-volatile memory device of claim 14, wherein the first sensing timing and the second sensing timing are different.

17. The non-volatile memory device of claim 14, wherein each of the first sensing timing and the second sensing timing is a bit line pre-charging time or a pre-charged bit line sensing time.

18. The non-volatile memory device of claim 14, wherein the M-bit data is 3-bit data.

19. The non-volatile memory device of claim 14, wherein the control logic controls the address decoder and the page buffers for performing a first high speed program operation for storing N-bit data in the memory cells and performing a first high speed sensing verify operation before the low reliability high speed program operation, wherein the N-bit data is 2-bit data.

20. The non-volatile memory device of claim 14, wherein each page buffer comprises:
- a current sensor that senses a current at a sensing node connected with a memory cell in response to a mode signal; and
- a voltage sensor that senses a voltage of the sensing node in response to the mode signal,
- wherein the current sensor is used to sense at a high speed and the voltage sensor is used to sense data accurately.

21. The non-volatile memory device of claim 20,
- wherein when the current sensor is activated by the mode signal, the voltage sensor is inactivated by the mode signal,
- wherein when the current sensor is activated, the control logic controls timing so as to pre-charge bit lines and to sense the pre-charged bit lines simultaneously, and
- wherein when the voltage sensor is activated, the control logic controls timing so as to sense even-numbered bit lines and odd-numbered bit lines in turn.

22. The non-volatile memory device of claim 14, wherein each page buffer comprises:
- a high-speed sensor that senses current at a sensing node connected with a memory cell in response to a mode signal; and
- an accurate sensor that senses a voltage of the sensing node in response to the mode signal.

23. The non-volatile memory device of claim 22, wherein when the high-speed sensor is activated by the mode signal, the accurate sensor is inactivated by the mode signal.

24. The non-volatile memory device of claim 14, wherein each page buffer comprises a plurality of sensors, each sensor sensing data at a sensing node connected with a memory cell in response to a respective digital mode signal.

25. The non-volatile memory device of claim 14, wherein each page buffer comprises both a current and a voltage sensor that selects current sensing or voltage sensing at a sensing node connected with a memory cell in response to a mode signal by controlling transistors in response to the mode signal.

26. The non-volatile memory device of claim 14, wherein each page buffer comprises a cell current determiner connected to a sensing node according to a switching operation of a mode select transistor responsive to a mode signal such that when the mode signal directs voltage sensing, the cell current determiner is electrically isolated from the sensing node and when the mode signal directs current sensing the sensing node is electrically connected to a memory cell via a bit line, the cell current determiner being configured to judge a data state of the memory cell by comparing a reference current with current flowing into the bit line connected with the sensing node.

27. The non-volatile memory device of claim 26, wherein each page buffer further comprises:
- a pull-up circuit configured to supply a power supply voltage to the sensing node in response to a bit line setup signal;
- a pull-down circuit configured to provide a ground voltage to the sensing node in response to the bit line setup signal;
- a bit line select transistor;
- a bit line control transistor;
- first to third mode select transistors;
- an inverter; and
- a sensing latch,
- wherein the pull-up circuit is connected to a sensing node according to a switching operation of the first mode select transistor, a switching operation of the first mode select transistor being determined according to the mode signal,
- wherein an inverted version of the mode signal transferred via the inverter is supplied to the first mode select transistor,
- wherein when the mode signal directs voltage sensing, the pull-up circuit applies a power supply voltage to the sensing node in response to the bit line setup signal,
- wherein the pull-down circuit is connected with the sensing node according to a switching operation of the second mode select transistor, wherein an inverted version of the mode signal transferred via the inverter is supplied to the second mode select transistor, wherein the bit line control transistor prevents a high voltage from being transferred to the sensing node in response to the bit line control signal, the bit line control transistor being used to protect the page buffer from a high voltage applied to the bit line, wherein the bit line select transistor is connected between the bit line control transistor and the bit line, the bit line select transistor being configured to connect the bit line to the page buffer in response to a bit line select signal, and wherein the sensing latch senses a voltage level of the bit line to store data of a memory cell connected with the bit line, or stores data latched in any one of a plurality of data latches at a program operation or a read operation.

28. The non-volatile memory device of claim 14, wherein each of the low reliability ;high speed program operation and the high reliability accurate program operation includes a plurality of programming voltage pulses for storing the M-bit data in the memory cells.

* * * * *